United States Patent
Dickmann

(10) Patent No.: US 6,225,793 B1
(45) Date of Patent: May 1, 2001

(54) SOLAR POWER GENERATION CIRCUIT INCLUDING BYPASS DIODES CONNECTED IN PARALLEL TO GROUPS OF SERIES CONNECTED SOLAR CELLS

(75) Inventor: Peter Dickmann, Grossenhausen (DE)

(73) Assignee: Angewandte Solarenergie- ASE GmbH, Alzenau (DE)

( * ) Notice: Subject to any disclaimer, the term of this patent is extended or adjusted under 35 U.S.C. 154(b) by 0 days.

(21) Appl. No.: 09/545,328

(22) Filed: Apr. 7, 2000

(30) Foreign Application Priority Data

Apr. 13, 1999 (DE) .............................. 199 16 742

(51) Int. Cl.[7] .................................................. G05F 1/613
(52) U.S. Cl. ............................................. 323/230; 323/906
(58) Field of Search ..................................... 323/229, 230, 323/231, 906

(56) References Cited

U.S. PATENT DOCUMENTS

| | | | |
|---|---|---|---|
| 4,513,167 | * 4/1985 | Brandstetter | 323/906 |
| 4,744,430 | * 5/1988 | McCoy | 323/906 |
| 5,235,232 | * 8/1993 | Conley et al. | 323/906 |
| 5,248,931 | * 9/1993 | Flesner et al. | 323/906 |
| 5,500,052 | * 3/1996 | Horivchi et al. | 323/906 |
| 5,677,833 | * 10/1997 | Bingley | 323/906 |

FOREIGN PATENT DOCUMENTS 88159639   4/1989   (DE) .............................. H02N/6/00

* cited by examiner

Primary Examiner—Jeffrey Sterrett
(74) Attorney, Agent, or Firm—Dennison, Scheiner, Schultz & Wakeman

(57) ABSTRACT

The invention relates to a circuit arrangement for power generation with solar cells (10 to 32). The solar cells are connected in series and in strings (34 to 44) each of several cells. A bypass diode (50 to 60) is connected in parallel to each string (34 to 44). Further diodes (64 to 70) are connected in parallel to two and/or more bypass diodes of series-connected strings. With this arrangement, the number of current-carrying diodes is considerably reduced when any strings are in shade.

5 Claims, 3 Drawing Sheets

SOLAR POWER GENERATION CIRCUIT INCLUDING BYPASS DIODES CONNECTED IN PARALLEL TO GROUPS OF SERIES CONNECTED SOLAR CELLS

BACKGROUND OF THE INVENTION

1. Field of the Invention

The invention relates to a circuit arrangement for power generation with solar cells connected in series and in strings of several solar cells, where the strings, to each of which a bypass diode is connected in parallel, are connected in series.

Photovoltaic systems for transforming solar energy into electrical energy comprise solar cells arranged in modules on which are arranged strings of solar cells connected in series and each jumpered by a bypass diode. The strings are also connected in series. The modules with the strings of solar cells are generally of plate-like design. The plates have thin-film solar cells in adjacent strips. The conditions at the installation location of the modules frequently do not allow identical radiation onto all strings of a module, and it may be that strings are in the shade of neighboring objects and hence cannot play any part in power generation.

2. Description of Related Art

To prevent the operation of shaded solar cells, which are for that reason polarized in the non-conducting direction, bypass diodes are used that revert to the conducting state when the strings are in shade. Since the bypass diodes have internal resistances during operation in the conducting direction, heat losses due to current occur in them, thereby reducing the efficiency of the photovoltaic system. The currents flowing via the bypass diodes must not heat up the diodes beyond permitted limit temperatures. Precautions must therefore be taken for heat dissipation by convection and/or radiation, for example by mounting the bypass diodes on heat sinks.

The strings are provided with connections for external lines. The lines from and to the strings are arranged with their one end in connection boxes in which the strings are connected to one another.

When numerous strings and possibly solar modules are connected in series, relatively high currents flow via the bypass diodes of individual strings when the latter are in shade. The number of strings in shade corresponds to the number of conducting bypass diodes. The energy yield of a photovoltaic system is therefore also reduced by the bypass diodes in an unwelcome way when the strings are in shade.

A solar generator is described in DE 88 15 963.9U1, in which each solar cell module is connected in parallel to a shunt diode and the latter to an LED, in order to rapidly detect a defective solar cell module by visual means.

SUMMARY OF THE INVENTION

The problem underlying the present invention is to develop a circuit arrangement with solar cells connected in series and in strings and provided with a bypass diode for each string, to the extent that the rise in the power loss proportional to the number of shaded and hence non-conducting strings, and resulting from currents in the bypass diodes when two and/or more strings in a series of strings are non-conducting, is substantially reduced.

The problem is, in a circuit arrangement with solar cells connected in series and in strings and with strings connected in series, each of which has a bypass diode, substantially solved in accordance with the invention in that in each case a diode is connected in parallel to two and/or more than two bypass diodes connected in series and connected in parallel to a string. If in the circuit in accordance with the invention those strings connected in series whose bypass diodes are jumpered by a parallel diode are polarized in the non-conducting direction, i.e. by shading, the current flows via the parallel diode, as a result of which the power loss only occurs in one diode. In each two bypass diodes jumpered by a parallel diode, only half as many diodes would be carrying current as bypass diodes are present, in the event that all strings consist of an even number and are polarized in the non-conducting direction.

This shows the considerable reduction of the power loss in the circuit in accordance with the invention. The power loss in diodes can be reduced even further by other diodes jumpering several bypass diodes.

In a convenient embodiment, the bypass diodes and the diodes parallel thereto for two or more strings are arranged on one side of the printed circuit board, and on the other side printed conductors with connection points for external lines and with plated-through holes for the connections of the bypass diodes are provided, with metal surfaces as contact faces for the bypass diodes and the diodes being provided on the surface of the printed circuit board. With this embodiment, a heat transfer takes place from the bypass diodes and the other diodes to the metal surfaces. Since only a few of the diodes arranged on the printed circuit board carry current even when there is a large number of non-conducting strings, the board with the metal surfaces is sufficient for dissipating the heat. The printed circuit board with the bypass diodes and the diodes jumpering these takes up very little space. The printed circuit board with the bypass diodes and further diodes for a large number of strings is preferably arranged in a connection box.

Schottky diodes are preferably used as bypass diodes and as diodes parallel to the bypass diodes. Schottky diodes have a low internal resistance in the conducting direction. The result is low voltage drops and heat losses.

Further details, advantages and features of the invention are shown not only in the claims and in the features they contain —singly and/or in combination —but also in the following description of a preferred embodiment shown in the drawing.

DETAILED DESCRIPTION OF THE INVENTION

Figure 1:
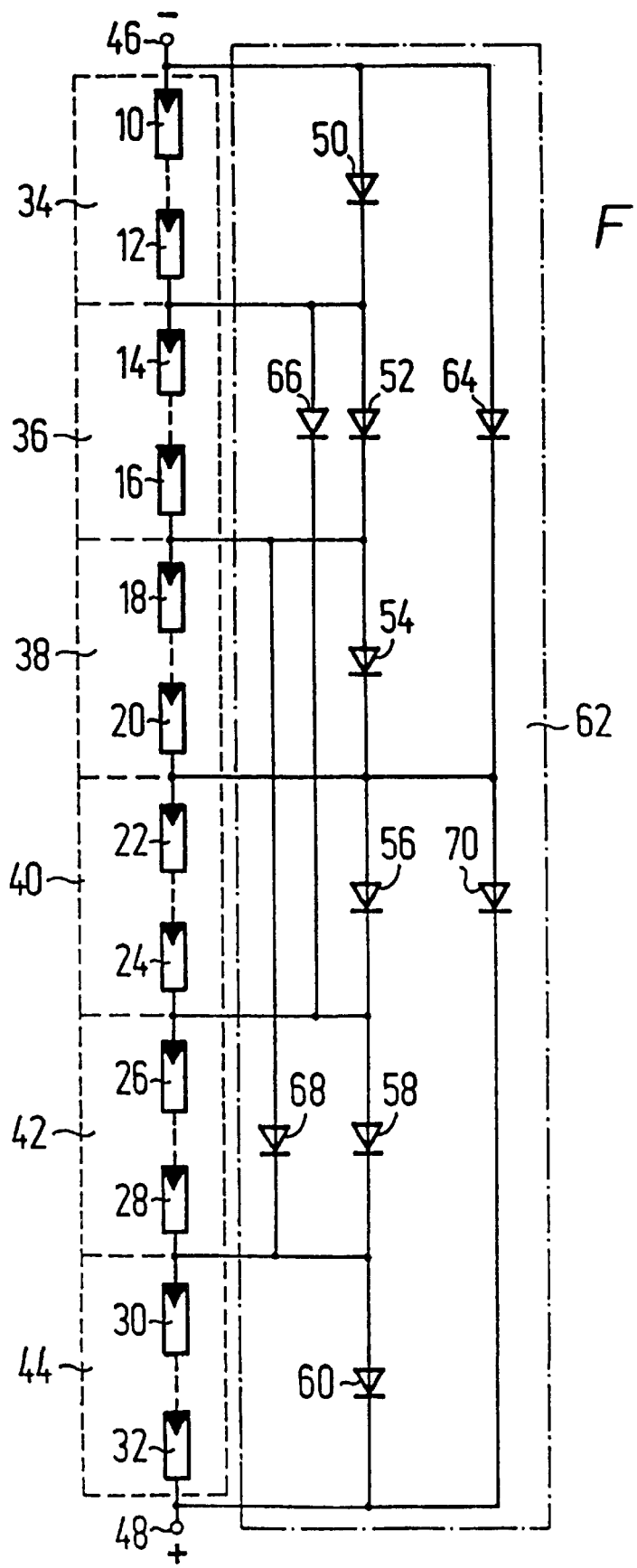
FIG. 1 shows a circuit diagram of an arrangement for power generation with solar cells.

A circuit arrangement for power generation has a large number of solar cells of which the drawing shows only the solar cells 10, 12, 14, 16, 18, 20, 22, 24, 26, 28, 30 and 32. The solar cells 10 to 32 are arranged in strings 34, 36, 38, 40, 42 and 44, indicated in the drawing by dashed borders. The string 34 contains the solar cells 10, 12, connected in series to further solar cells, not shown. The string 36 contains the solar cells 14, 16 and further solar cells connected in series, not shown. The solar cells 18, 20; 22, 24;

26, 28 and 30, 32 are arranged in the strings 38, 40, 42 and 44 respectively in series with further solar cells, not shown. Each string 34 to 44 contains, for example, 20 solar cells, generating a voltage of approx. 10 V at 3 A under standard irradiation conditions and at a temperature of 25° C.

The strings 34 to 44 are likewise connected in series. The arrangement shown in FIG. 1 therefore shows under the aforementioned conditions 60 V at 3 A, with the connection point 48 being positive. The connection points 46, 48, the solar cells 10 to 32 and the further solar cells, not shown, are part of a solar module, not shown in detail, having a plate-like design. The solar cells 10 to 32 and the solar cells not shown are arranged in strips on the flat plate of the solar module. The solar module shown in FIG. 1 with the solar cells 10 to 32 and the further solar cells not shown can be connected in series with one or more solar modules having the same design, for example. The solar module according to FIG. 1 and the arrangement comprising several similar solar modules feeds a consumer unit or is connected to an inverter that makes a connection to an AC network.

A bypass diode 50, 52, 54, 56, 58 and 60 is connected in parallel to the solar cells of each string 34, 36, 38, 40, 42 and 44. The bypass diodes 50 to 60 are in a connection box 62 attached separately from the solar module and shown in a dash-dotted line in FIG. 1.

In the circuit arrangement shown in FIG. 1, each three bypass diodes are jumpered by a diode connected in parallel. The bypass diodes 50, 52, 54 are connected in parallel to a diode 64. A diode 66 is connected in parallel to the bypass diodes 52, 54 and 56. A diode 68 is connected in parallel to the bypass diodes 54, 56 and 58. Finally, a diode 70 is connected in parallel to the bypass diodes 56, 58 and 60. The diodes 66, 64, 68 and 70 are also bypass diodes, which however are connected in parallel not to one but to three strings. To better distinguish the diodes 64, 66, 68 and 70 from the bypass diodes 50 to 60, they are referred to simply as diodes or further diodes.

The bypass diodes 50 to 60 are polarized, in relation to the strings 34 to 44 connected in parallel, in the non-conducting direction when the solar cells are active, i.e. irradiated, and are hence non-conducting. The connection point 48 has positive potential, for example, and the connection point 46 negative potential. If one of the strings 34 to 44 is no longer active, because it is for example in shade, it is in the non-conducting state and not making any further contribution to the voltage/current of the solar module. The other strings still active still generate current, which flows via the bypass diode of the non-active string. The result is, at the internal resistor of the bypass diode working in the conducting direction, a voltage drop which reduces the energy yield of the solar module. Furthermore, heat loss results in the bypass diode carrying current, which must be dissipated to ensure that the permissible temperature in the bypass diode is not exceeded. The bypass diodes 50 to 60 and the further diodes 64 to 70 are Schottky diodes whose internal resistances are low in conducting mode, this being intended to minimize the heat losses.

If a string is not activated in the arrangement shown in FIG. 1, the current generated by the other strings and for example by a further solar module flows via only one bypass diode. If two strings of the arrangement shown are not active, two bypass diodes are current-carrying. If three strings of the arrangement shown in FIG. 1 are not active, for example due to being in the shade, either just one, or two or three of the diodes 50 to 60 or 64 to 70 are active, depending on the position of the non-active string in the sequence of strings. Since however the probability is low that three or more strings in a solar module and not adjacent to one another are not active due to shading, generally speaking a maximum of two diodes have current flowing through them in spite of three or more strings being in shade.

Figure 3:
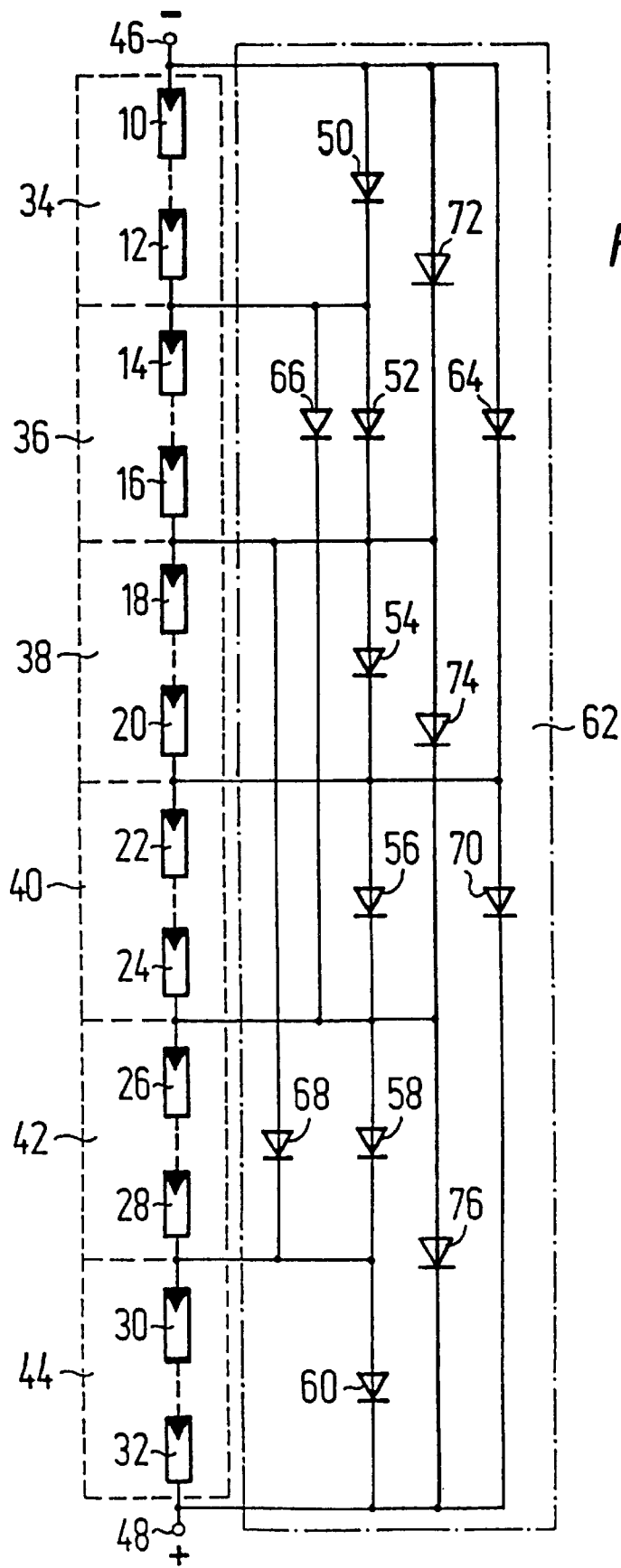

FIG. 1 shows a further possibility for reducing the diodes carrying current when strings are in shade. This further possibility consists of a diode 72, 74 or 76 being connected in parallel to two series-connected strings 34, 36; 38, 40 or 42, 44 respectively. This additional possibility, the circuitry of which is shown in FIG. 3, has the effect that when two adjacent strings are in shade only one diode is current-carrying. The arrangement of the diodes 72, 74 and 76 parallel to the appropriate strings and their bypass diodes has the effect of reducing the current-carrying diodes when strings are in shade even without the diodes 64, 66, 68 and 70. In conjunction with the diodes 64 to 70, a considerable reduction of the current-carrying diodes can be achieved with any number of shaded strings and whatever their position in the sequence.

It is furthermore possible to connect further diodes in parallel to the strings 34 to 44 or to their bypass diodes such that only one diode is ever carrying current, regardless of the number of shaded strings. In an arrangement of this type, diodes must also be provided that jumper not only two or three but also four and five strings connected in parallel. The use of this arrangement is determined by space reasons in the connection box and by economic reasons as regards the expenditure.

Figure 2:
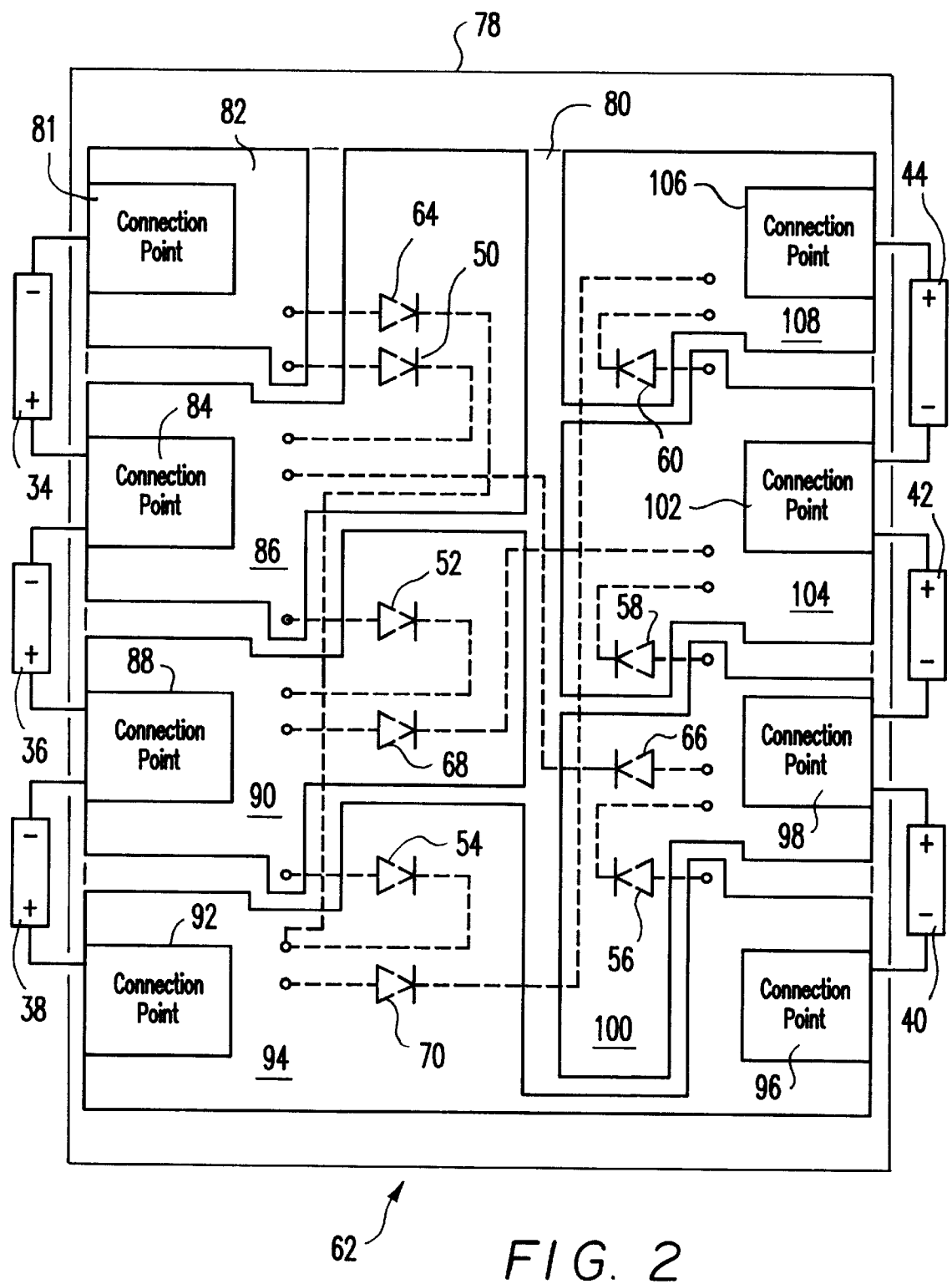
FIG. 2 shows a connection box from the inside with a printed circuit board for connection of solar cells connected in series and in strings, with bypass diodes and diodes connected in parallel thereto in diagram form; and, FIG. 3 shows a circuit diagram of a second arrangement for power generation with solar cells.

FIG. 2 is a diagram showing the connection box 62 with a printed circuit board 80 arranged in a plastic housing 78. A flat side of the printed circuit board 80 is shown. The string 34 is connected by its negative terminal via a line not shown in detail to a connection point 81 associated with a wide-surface printed conductor 82 on the one side of the board. The same board side has a connection point 84 of a wide-surface printed conductor 86. The connection point 84 connects the positive terminal of the string 34 and the negative terminal of the string 36 via lines not shown in detail. A further connection point 88 of a wide-surface printed conductor 90 is connected to the positive terminal of the string 36 and the negative terminal of the string 38. The positive terminal of the string 38 is connected via a line to a connection point 92 of a wide-surface printed conductor 94 extending over the entire width of the printed circuit board 80. The printed conductors 82, 86 and 90 run only to about the center of the printed circuit board 80. The connection points 81, 84, 88 and 92 are on the same side of the printed circuit board 80. The printed conductor 94 has a second connection point 96 on that side of the printed circuit board 80 opposite the connection points 81 to 92. The negative terminal of the string 40 is connected to the connection point 96 via a line, not shown in detail. The positive terminal of the string 40 is connected to a connection point 98 of a wide-surface printed conductor 100 adjoining the printed conductors 90 and 94 approximately in the center of the printed circuit board 80 at an electrically insulating distance. The negative terminal of string 42 too is connected to the connection point 98 by a line, not shown in detail. The positive terminal of the string 42 is connected to a connection point 102 of a wide-surface printed conductor 104 via a line, not shown in detail. The negative terminal of the string 44 is also connected to the connection point 102 via a line, with the positive terminal of string 44 being connected to a connection point 106 of a wide-surface printed conductor 108.

The bypass diodes 50 to 60 are arranged on that side of the printed circuit board 80 opposite the printed conductors 82, 86, 90, 94, 100, 104 and 108. The bypass diode 50 is connected via holes with plated-through contacts in the printed circuit board 80 at one end to the printed conductor 86 and at the other end to the printed conductor 86. The bypass diode 52 is connected in the same way to the printed conductors 86 and 90. The bypass diode 54 is connected via holes with plated-through contacts in the printed circuit board 80 to the printed conductor 90 and the printed conductor 9 respectively. The bypass diode 56 is connected via holes with plated-through contacts to the printed conductor 94 and to the printed conductor 100 respectively. The bypass diode 58 is connected in the same way to the printed conductors 100 and 104. Finally, the bypass diode 60 is connected via holes with plated-through contacts in the printed circuit board 80 to the printed conductor 104 and to the printed conductor 108.

The diode 64 is connected by the anode to the printed conductor 82 and by the cathode to the printed conductor 94. The diode 66 is connected by the anode to the printed conductor 86 and by the cathode to the printed conductor 100. The diode 68 is connected by the anode to the printed conductor 90 and by the cathode to the printed conductor 104. The diode 70 is connected by the anode to the printed conductor 94 and by the cathode to the printed conductor 108.

The bypass diodes 50 to 60 and the diodes 64 to 70 are Schottky diodes and each contact a metal layer, not shown in detail, on the printed circuit board 80. The metal layers absorb a large part of the heat generated by the current flow in the respective diode and dissipate it by convection or radiation into the atmosphere. Since the number of current-carrying diodes is limited to three even when all strings 34 to 44 are shaded, the heat is well dissipated even in a compact design of the printed circuit board 80 and of the connection box 62, The connection box 62 can therefore be designed as a plastic element with appropriate leadthroughs for the lines leading to the strings. The solar module with the strings 34 to 44 is generally arranged outside a building. The connection box 62 is preferably located inside the building.

I claim:

1. A circuit arrangement for power generation from solar cells comprising:
    a plurality of series connected strings (34, 36, 38, 40, 42, 44), each having a plurality of series connected solar cells (10, 12, 14, 16, 18, 20, 22, 24, 26, 28, 30, 32);
    a plurality of bypass diodes (50, 52, 54, 56, 58, 60) connected in parallel respectively to each of the plurality of strings; and,
    a plurality of diodes (64, 66, 68, 70) connected in parallel to at least two of the bypass diodes.

2. Circuit arrangement according to claim 1, wherein the bypass diodes (50, 52, 54; 52, 54, 56; 54, 56, 58; 56, 58, 60) of three series-connected strings (34, 36, 38; 36, 38, 40; 38, 40, 42; 40, 42, 44) respectively or three series-connected strings of solar cells (10–32) are connected in parallel to a diode (64; 66; 68; 70) respectively.

3. Circuit arrangement according to claim 2, wherein the printed circuit board (80) with the bypass diodes (50 to 60) and the diodes (64 to 70) connected in parallel to them are arranged in a plastic housing (78).

4. Circuit arrangement according to claim 1, wherein the bypass diodes (50 to 60) and the diodes (64 to 70) connected in parallel to them are preferably Schottky diodes.

5. Circuit arrangement according to claim 1, wherein the bypass diodes (50 to 60) and the diodes (64 to 70) parallel thereto for two or more strings (34 to 44) of solar cells are arranged on one side of a printed circuit board (80), and on the other side printed conductors (82, 86, 90, 94, 100, 102, 104) with connection points (80, 84, 88, 92, 96, 98, 102, 106) for external lines and with plated-through holes for connections of the bypass diodes (50 to 60) are provided, and wherein metal surfaces as contact faces for the bypass diodes (50 to 60) and the diodes (64 to 70) are provided on the surface of the printed circuit board (80).

* * * * *